(12) United States Patent
Takahashi et al.

(10) Patent No.: US 8,239,180 B2
(45) Date of Patent: Aug. 7, 2012

(54) NUMERICAL STRUCTURAL ANALYSIS SYSTEM BASED ON THE LOAD-TRANSFER-PATH METHOD

(75) Inventors: Kunihiro Takahashi, Yokohama (JP); Toshiaki Sakurai, Yokohama (JP)

(73) Assignee: Keio University, Tokyo (JP)

( * ) Notice: Subject to any disclaimer, the term of this patent is extended or adjusted under 35 U.S.C. 154(b) by 963 days.

(21) Appl. No.: 12/092,571

(22) PCT Filed: Nov. 6, 2006

(86) PCT No.: PCT/JP2006/322069
§ 371 (c)(1),
(2), (4) Date: May 2, 2008

(87) PCT Pub. No.: WO2007/052784
PCT Pub. Date: May 10, 2007

(65) Prior Publication Data
US 2009/0125282 A1    May 14, 2009

(30) Foreign Application Priority Data

Nov. 7, 2005    (JP) .................................. 2005-321695

(51) Int. Cl.
*G06G 7/48*    (2006.01)
(52) U.S. Cl. .......................................................... 703/7
(58) Field of Classification Search ........................ 703/7
See application file for complete search history.

(56) References Cited

FOREIGN PATENT DOCUMENTS

| | | |
|---|---|---|
| JP | 2003-344041 A | 12/2003 |
| JP | 2004-133704 A | 4/2004 |
| JP | 2004-138526 A | 5/2004 |

OTHER PUBLICATIONS

Hoshino et al.; Application of ADAMS for Vibration Analysis and Structure Evaluation by NASTRAN for Cab Floor of Heavy-Duty Truck, The 1st MSC.ADAMS European User Conference, London, Nov. 2002; pp. 1-6.*
Bilski v. Kappos, 130 S. Ct. 3218, 561 US_, 177 L. Ed. 2d 792 (2010); pp. 1-71.*

(Continued)

*Primary Examiner* — Hugh Jones
(74) *Attorney, Agent, or Firm* — patenttm.us

(57) ABSTRACT

The purpose of this invention is to reduce the calculation time in the numerical structure analysis system based on load-transfer-path method.

Figure 1:
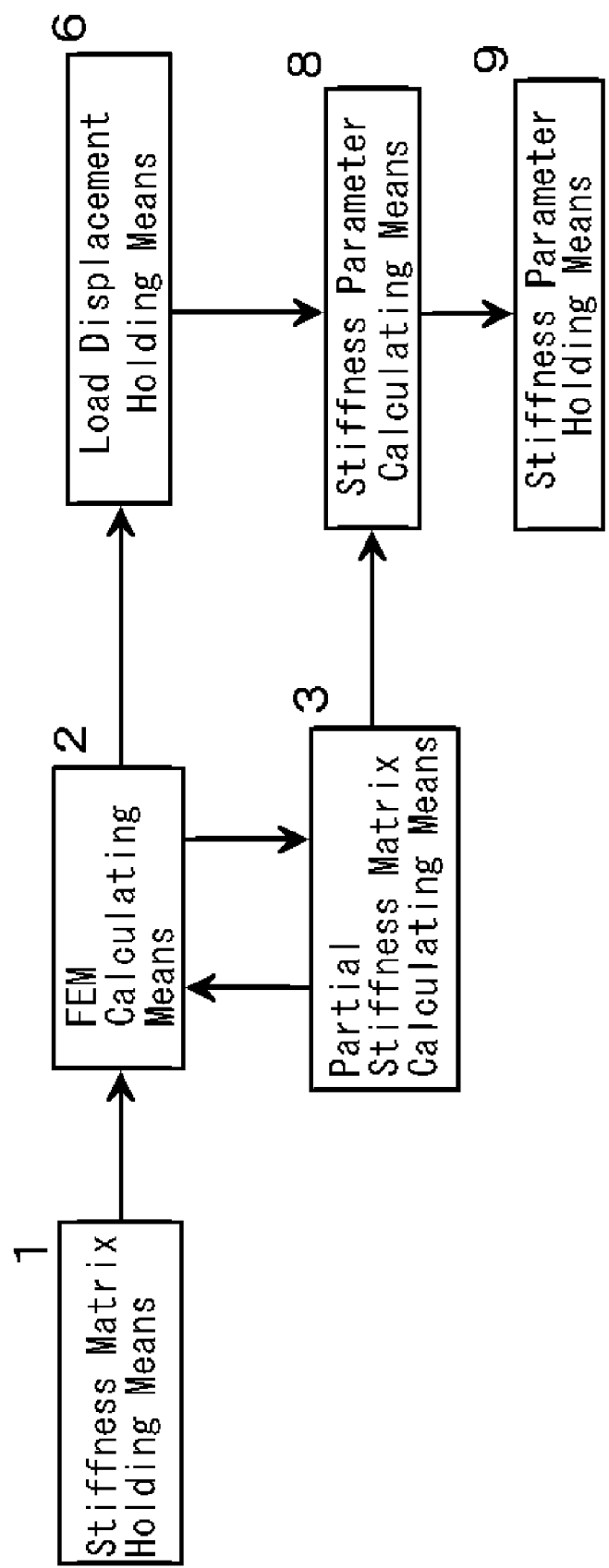

The parameters are set in the condition that the supporting point B in the objective structure is fixed and the load is applied to the specific loading point A. The FEM calculation means 2 calculates the deformation of the objective structure according to the structural stiffness matrix in the stiffness matrix holding means 1 to find the basic data such as the displacement of each point and so on. The FEM calculation means calculates each deformation to find the displacement under the condition that the specific loading point A and the supporting point B are fixed and three inspection loadings are applied to the variable loading point C. The partial stiffness matrix calculation means 3 solves the multidimensional simultaneous linear equation based upon the internal stiffness matrix of the objective structure, the load value and the displacement to find the partial stiffness matrix $K_{AC}$. The stiffness parameter calculation means 8 calculates the value of the stiffness parameter U* according to the partial stiffness matrix $K_{AC}$ and the displacement in the basic data and so on. The value of U* of each point is calculated with changing the variable loading point C as to follow sequentially all the necessary points in the objective structure.

9 Claims, 9 Drawing Sheets

OTHER PUBLICATIONS

Federal Register / vol. 75, No. 143 / Tuesday, Jul. 27, 2010 / Notices; pp. 1-7.*

*CyberSource Corp.* v. *Retail Decisions, Inc.*, (Fed. Cir., Aug. 16, 2011) pp. 1-21.*

Kunihiro Takahashi; Conditions for desirable structures based on a concept of load transfer courses, Proc. ISEC-01, pp. 699-702, 2001.

Toshiaki Sakurai, Hiroaki Hoshino, Kunihiro Takahashi; Vibration Reduction for Cabins of Heavy-Duty Trucks with a Concept of Load Path, Proc. JSAE No. 36-02, pp. 5-8, 2002 (in Japanese with English summary).

Toshiaki Sakurai, Masatoshi Abe, Soei Okina, Kunihiro Takahashi; Expression of Load Transfer Paths in Structural Analysis and its Applications, Trans. JSCES, vol. 8, pp. 401-404, May 2003.

Toshiaki Sakurai, Junichi Tanaka, Akinori Otani, Changjun Zhang, Kunihiro Takahashi; Load Path Optimization and U* Structural Analysis for Passenger Car Compartments under Frontal Collision, International Body Engineering Conference 2003, pp. 181-186, JSAE 20037007, SAE 2003-01-2734, 2003.

Hiroaki Hoshino, Toshiaki Sakurai, Kunihiro Takahashi: Vibration reduction in the cabins of heavy-duty trucks using the theory of load transfer paths, JSAE Review 24(2003) 165-171.

Kunihiro Takahashi, Toshiaki Sakurai: Expression of Load Transfer Paths in Structures, J. JSME, (A)71-708 (2005), pp. 1097-1102.

Kengo Inoue, Yuichiro Ichiki, Ikuma Matsuda, Toshiaki Sakurai, Hideaki Ishii, Tetsuo Nohara, Hiroaki Hoshino, Kunihiro Takahashi: Experimental study of U* analysis in load transfer using the actual heavy-duty track cabin structure and scaled model, Proc. JSAE, No. 90-04, pp. 27-30, 2004.

Hiroaki Hoshino, Toshiaki Sakurai, Kunihiro Takahashi; Application of ADAMS for Vibration Analysis and Structure Evaluation by NASTRAN for Cab Floor of Heavy-Duty Truck, The 1st MSC. ADAMS European User Conference, London, Nov. 2002.

Toshiaki Sakurai, Hiroaki Hoshino, Masatoshi Abe, Kunihiro Takahashi; ADAMS Application for the Floor Vibration in the Cabin of Heavy-duty Trucks and U* Analysis of the Load Path by NASTRAN, (MSC.ADAMS User Conference 2002).

* cited by examiner (a) Comparison of Time for U* Analysis
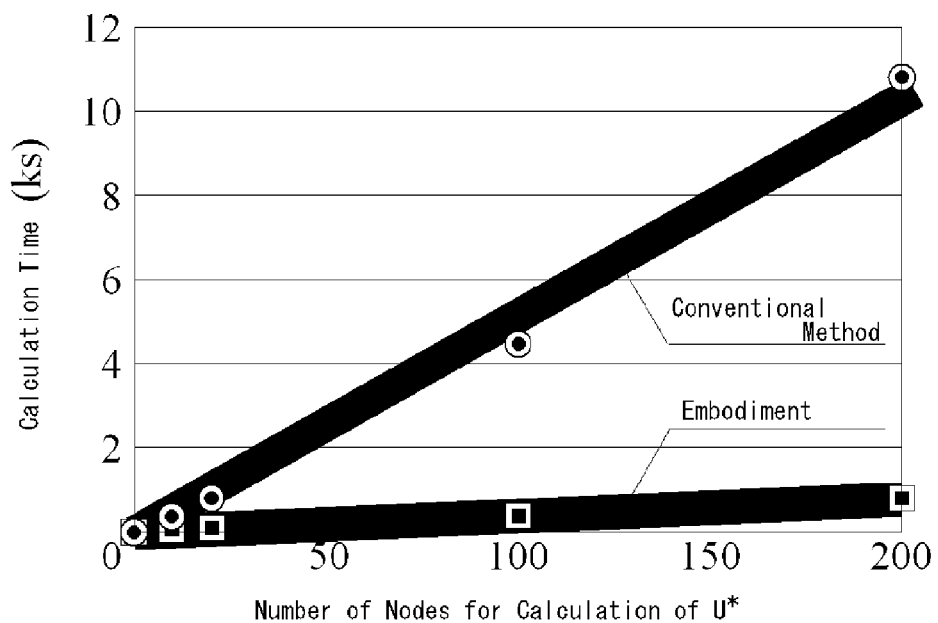
FIG. 4
(b) Calculation Result (U* Distribution of Front by Contours)
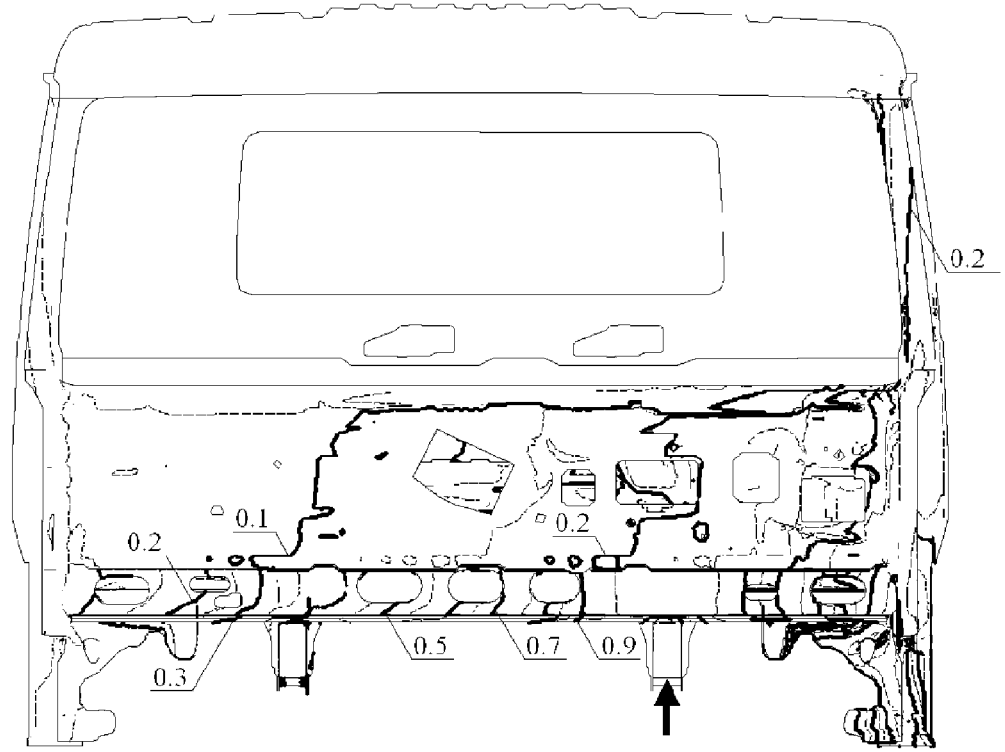

(a) Calculation Result (U* Distribution of Side by Contours)
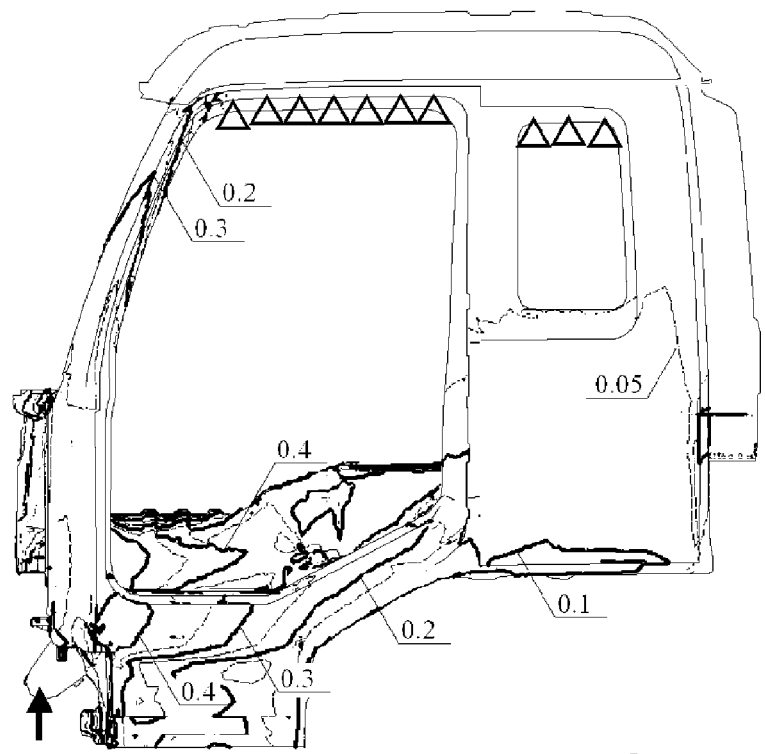
FIG. 5
(b) Calculation Result (U* Distribution of Bottom by Contours)
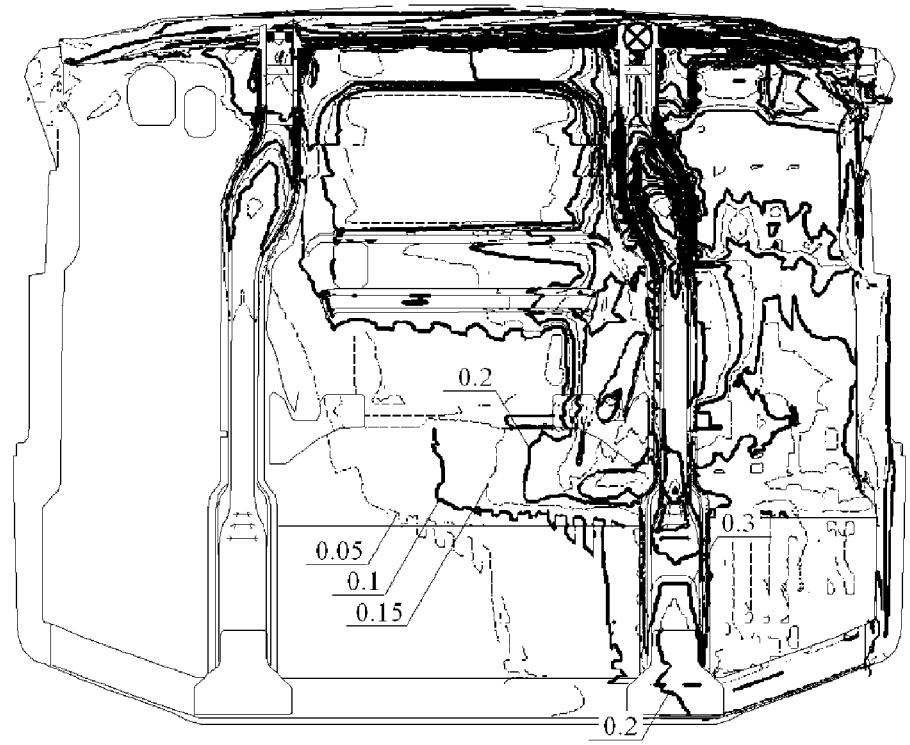

NUMERICAL STRUCTURAL ANALYSIS SYSTEM BASED ON THE LOAD-TRANSFER-PATH METHOD

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

BACKGROUND OF THE INVENTION

1. Field of the Invention

This invention relates to a numerical structural analysis system, especially to the numerical structural analysis system to perform the structural analysis of the objective structure for analysis by the load-transfer-path method utilizing the finite-element method.

2. Background Art

In the structural design, high stiffness, high strength, light-weight and so on are aimed. In order to achieve these aims, it is necessary to study all over the structure. It is general to use the stress or strain to study the strength and the stiffness of the structure. However, in the structural design, instead, it is necessary that the conception is designed paying attention to the transfer path of the force or the load transmission. Therefore, it is an important subject to know the transfer path of the force inside of the structure. The transfer of force has been so far estimated by stress. The stress means the force for a unit area. It can be considered that the force is strongly transferred through high stress points. The stress has been analyzed by experimental measurement or computer simulation. It is sometimes performed that the value of the principal stress is shown by an arrow perpendicular to the equal-stress surface, its distribution is drawn in the figure of the structure, and the transfer of force is expressed by the distribution of the arrows.

However, this consideration has some problems. Even if the force is not effectively transferred, a large stress may arise for the sake of stress concentration. The consideration of force transfer with stress may mislead to the wrong conclusion. For example, if there is a small circular hole in the structure, it gives rise to a stress concentration in that part and there arises a large principal stress. But, it is curious that the circular hole is considered to transfer the force strongly. It should not be considered that the part becomes to transfer the large load. If so, such wrong conclusion is conducted that a circular hole should be made in order to transfer the force strongly. Differently, it should be concluded that a circular hole makes to transfer the force a little away from the hole. A new parameter different from stress is necessary in order to consider so.

Therefore, the inventors proposed a new parameter as U* with respect to the force transfer and its path. U* is the parameter based upon the idea entirely different from stress. Though the parameter is conducted according to the intuitive concept, it can be shown that U* is useful in the structural design by clearing the close relation between U* and the force transfer through the example of concrete calculation of U*.

Moreover, the method to express definitely the load-transfer path with U* is explained by introducing the U* potential, stiffness line and stiffness decay vector. Hereinafter, the outline of U* is explained. The details of the concrete calculation example and so on are available referring to the non-patent documents 1 through 9.

U* can be obtained according to the ratio of the reactive force with an arbitrary point in the structure unfixed and the reactive force with the point fixed when force is applied to the structure. U* is the parameter to express the connective strength between the loading point and an arbitrary point. It is also a parameter to express the load transfer in the structure. U* is a potential quantity. It is able to show the direction of force transfer in the structure by calculation of U* distribution. It is able to obtain the stiffness decay vector to indicate the load-transfer direction by calculation of the gradient of the U* distribution. The stiffness line to indicate the force transfer path can be derived by tracing the stiffness decay vectors. The path to transfer the load most strongly in the stiffness lines to the supporting point from the loading point is defined as load-transfer path. It becomes possible to estimate the load transfer in the structure quantitatively by using this load-transfer path. That is, using the parameter U*, the aspect of the load transfer in the structure is expressed quantitatively, and the principal load-transfer path inside is found according to the U* distribution in the structure. It is possible to clarify the improvement in the structure by evaluation of the obtained load-transfer path. Optimizing the structure by use of U*, even though only the load transfer is regarded, such solution is obtained as equivalent to the optimum solution in the conventional method where the strain energy is aimed to be uniform. Thus the efficiency of U* is ascertained. And also, other than the computer simulation using FEM, the measurement of U* using the actual vehicle body is performed. This method of structural analysis is decided for calling the load-transfer-path method.

Figure 8:
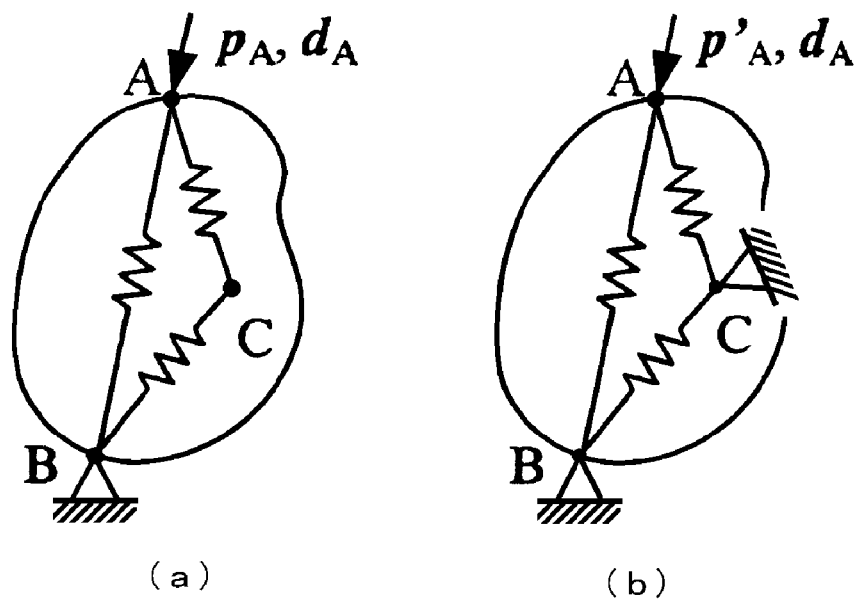
Figure 8:
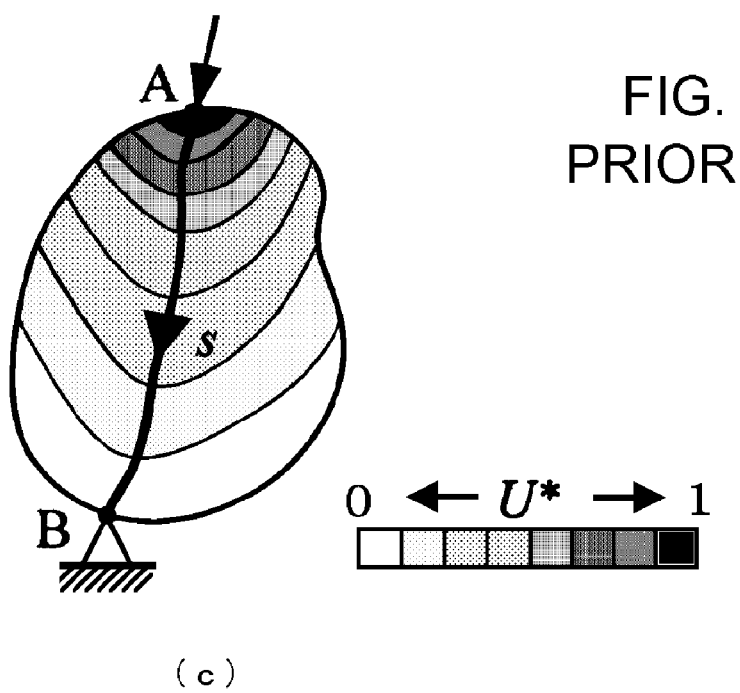

The concept and the definition of U* are explained. FIG. 8 shows the model of arbitrary elastic structure. In FIG. 8(a), the loading point is denoted by A, the supporting point is denoted by B and an arbitrary inner point of the structure is denoted by C. FIG. 8(b) shows the case when the arbitrary point C is constrained. In both of FIGS. 8(a) and 8(b), the same displacement $d_A$ is given to the loading point A. In the case of FIG. 8(a), the strain energy stored in the inside is defined as U. In the case of FIG. 8(b), the strain energy stored in the inside is defined as U'. The ratio U'/U of both becomes always greater than or equal to 1, this ratio is considered to become as high value as the connectivity between the internal point C and the loading point A is strong. For example, considering one linear spring, the distribution of U'/U with the variant of point C becomes a curve along the spring axis. Instead of U'/U, as shown in the Eq. (1), using the ratio (U'−U)/U', this value can be expressed as a uniformly decreasing line as it takes 1 at the loading point A and 0 at the supporting point B.

$$U^* \equiv (U' - U)/U' = 1 - (U'/U)^{-1} \tag{1}$$

Eq. (1) is the definition of U*. It is considered to show the strength of connectivity between the loading point A and the point C. U* is a function of the coordinate of the point C.

The load transfer path is explained. The distribution of U* can be obtained by numerical calculation or experiment. When the U* distribution in the structure is expressed by contour, the curve corresponding to ridgeline of the contour is corresponding to the line connecting sequentially the part strongly connected with the loading point. It is considered that the force is transferred following stiff parts. It can be said that the load is transferred along this ridgeline as a path. This ridgeline, the load transfer path S, is shown schematically in FIG. 8(c).

With respect to the load transfer path, three conditions to satisfy for the desirable structure are shown below.
(1) The uniformity of U* distribution in the load-transfer path: The distribution of U* should be close to the ideal line shown in FIG. 9(a).
(2) The continuity of internal stiffness in the load-transfer path: The distribution of U* curvature should be close to the ideal line shown in FIG. 9(b).
(3) The consistency of the load-transfer path: The load-transfer path S1 from the loading point toward the supporting point should coincide with the load-transfer path S2 when the loading point and the supporting point are exchanged each other as shown in FIG. 9(c).

The relation among the structure, load and displacement is explained. Three points A, B and C represent the structure. The relation between the load and the displacement at each point is denoted by Eq. (2).

$$\begin{Bmatrix} p_A \\ p_B \\ p_C \end{Bmatrix} = \begin{bmatrix} K_{AA} & K_{AB} & K_{AC} \\ K_{BA} & K_{BB} & K_{BC} \\ K_{CA} & K_{CB} & K_{CC} \end{bmatrix} \begin{Bmatrix} d_A \\ d_B \\ d_C \end{Bmatrix} \quad (2)$$

Each K with subscripts is the internal stiffness matrix of 3 times 3. p with subscript is the column vector to denote the load. d with subscript is the column vector to denote the displacement. At a glance, it seems like a primitive expression of FEM. But it is not. In Eq. (2), the effect of whole structure with respect to three points is expressed. Besides, even if the load is zero, under the condition to allow the uniform displacement of rigid body, the relation of Eq. (3) and so on is valid.

$$K_{AA} = -(K_{AB} + K_{AC}) \quad (3)$$

Besides, though K, p, d and so on are matrix or vector, as they cannot be represented by bold type, they are represented with the normal type.

The definition of U* by the Eq. (1) is expressed with Eq. (2). U is the displacement energy when only the supporting point B in FIG. 8(a) is fixed. In FIG. 8(a), as the supporting point B is fixed, $d_B$ becomes zero. Hence, using Eq. (2), $p_A$ can be expressed as ($K_{AA}$ $d_A$+$K_{AC}$ $d_C$). Using this relation, the displacement energy U in FIG. 8(a) is expressed by Eq. (4).

$$U = (1/2)p_A \cdot d_A \quad (4)$$
$$= (1/2)(K_{AA}d_A + K_{AC}d_C) \cdot d_A$$

In the productive operation, the representation of vector and tensor is used. The dot symbol means the inner product of vector.

On the other hand, U' is the displacement energy stored when the arbitrary point C in the structure in FIG. 9(b) is constrained. Also in this case, as the displacement of the loading point A is not changed to keep as $d_A$, the applied force $p'_A$ becomes only $K_{AA}$ $d_A$ according to Eq. (2). Then, U' is expressed as Eq. (5).

$$U' = (1/2)p'_A \cdot d_A = (1/2)(K_{AA}d_A) \cdot d_A \quad (5)$$

According to Eqs. (4) and (5), Eq. (6) is derived.

$$(U'/U) = \{(K_{AA}d_A) \cdot d_A\}/\{(K_{AA}d_A + K_{AC}d_C) \cdot d_A\} \quad (6)$$

The divisor takes constant if $d_A$ is given as predetermined value. Then U'/U can be seen to depend upon the numerator $K_{AA}$. This $K_{AA}$ is $-(K_{AB}+K_{AC})$ according to Eq. (3). It cannot be considered that it shows only $K_{AC}$ the strength of connectivity between the loading point A and the arbitrary point C. Therefore, the equation is transformed as follows.

According to Eq. (4) and Eq. (5), Eq. (7) is obtained.

$$U' = U - (\tfrac{1}{2})(K_{AC}d_C) \cdot d_A \quad (7)$$

Therefore, (U'/U) can be expressed as Eq. (8).

$$(U'/U) = 1 - \{(K_{AC}d_C) \cdot d_A\}/(2U) \quad (8)$$

Moreover, using Eq. (8) to the definition of U* in Eq. (1), finally, U* is expressed as Eq. (9).

$$U^* = 1 - \{1 - \{(K_{AC}d_C) \cdot d_A\}/(2U)\}^{-1} \quad (9)$$
$$= \{1 - (2U)/\{(K_{AC}d_C) \cdot d_A\}\}^{-1}$$
$$= \{1 - (p_A \cdot d_A)/\{(K_{AC}d_C) \cdot d_A\}\}$$

By expressing as Eq. (9), it has become clear that U* is the quantity depending upon the matrix $K_{AC}$ to express the stiffness between the loading point A and the arbitrary point C. That is, U* at the arbitrary point C can be expressed as the quantity with respect to the strength of connectivity with the loading point A. It could be said that the meaning of the value of U* has been clarified by Eq. (9). Besides, the above is the result based on the model of FIG. 8, when the supporting point are more than or equal to two, moreover, also when certain region is constrained, the similar result can be obtained. In any case, U*, which is defined by the ratio of the energy when the arbitrary point C is fixed and the energy when the arbitrary point C is not fixed, is expressed in the same form as Eq. (9), and it can be expressed by the internal stiffness matrix $K_{AC}$ between the loading point A and the arbitrary point C. Especially, this $K_{AC}$ should be called as the partial stiffness matrix to distinguish from other internal stiffness matrix.

U* potential and the path are explained. This U* can be given at any point in the structure. Considering U* decided at each point as potential, it is called as U* potential. The curve perpendicular to the equal-potential line is called as the stiffness line. The gradient gradU* along the stiffness line is expressing the decaying quantity of stiffness. This decaying quantity is expressed as Eq. (10).

$$k^{(-)} = -gradU^* \quad (10)$$

$k^{(-)}$ is named as the stiffness decaying vector. $k^{(-)}$ is conservative.

The contour of U* and the load path are explained. In general, the ridgeline with respect to the contour of the distribution of scalar quantity is defined as the curve with the smallest gradient among the lines perpendicular to the contour. The curve with the smallest gradient among the stiffness lines, that is, the curve made by connecting the smallest stiffness decay vectors is the ridgeline. If it is considered that the force is transferred along the part where the stiffness decay is small, this ridgeline can be called as the load transfer path. By considering the load transfer path according to the ridgeline of U* distribution, in the case of the presence of a circular hole, it is concluded that the force is transferred along the part a little apart from the circular hole.

The concrete method to calculate U* by definition is explained. In the case to calculate U* strictly as the definition, the following procedure is required.

(1) The energy necessary to cause the displacement at the loading point with the arbitrary point C free.

(2) The necessary energy to give the constant displacement at the loading point A with the arbitrary point C fixed is obtained by the structural calculation such as FEM. The obtained value is substituted into Eq. (1) to calculate U* with respect to the point.

(3) The calculation is repeated with varying the arbitrary point C sequentially. Thus, the overall distribution of U* can be obtained.

The finite element method (FEM) is usually employed to obtain U* by calculation. There are two solving methods in FEM, one is the displacement method and another is the force method. The displacement method is used in the general-purpose FEM software. In the displacement method, in the case to calculate repeatedly giving different load at each calculation, that is, in the case to calculate repeatedly with varying the loading condition (mechanical boundary condition), the simultaneous equation with respect to the structural stiffness matrix needs to be solved only once. But, in the case to calculate repeatedly with giving different displacement at each calculation, that is, in the case to calculate repeatedly with varying the displacement condition (geometric boundary condition), the simultaneous equation with respect to the structural stiffness matrix needs to be solved every time repeatedly. Therefore, in the calculation with many repetitions, the calculation complex becomes impractical. In FEM, in one analysis, as almost all the time is spent to calculate the simultaneous equation with respect to the structural stiffness matrix, in the calculation with many repetitions, the calculation complexity becomes impractical.

In the repetitive calculation of U*, the arbitrary point C is constrained. That is, zero displacement is given to the arbitrary point C selected at the different point at every time. As the geometric condition needs to be changed every time as this, the calculation complexity becomes impractical if as it is. The simultaneous linear equation with respect to structural stiffness matrix has even millions of variables. As the equation of millions of elements is to be solved, it takes a long time to solve it only once. Moreover, in order to find the distribution of U*, it is repeated millions of times. It is very important to reduce those repetition times.

The matrix $K_{AC}$ instead of U* is explained to have only to be calculated. $K_{AC}$ can be considered as the matrix of spring constant between the loading point of A and the arbitrary point of C. U* is given by the equation (1).

$$U^* = (1 - (U'/U)) \quad (1)$$

Eq. (1) can be expressed as Eq. (9) also.

$$U^* = \{1 - (2U)/\{(K_{AC}d_C) \cdot d_A\}\}^{-1} \quad (9)$$

Here, U is the deformation energy when the arbitrary point C is not fixed. The displacement $d_C$ and the displacement $d_A$ are the displacement of the arbitrary point C and the displacement of the loading point A respectively when the arbitrary point C is not fixed. Therefore, U, $d_C$ and $d_A$ have only to be calculated once at the first time. In order to calculate U* from Eq. (9), the matrix $K_{AC}$ is only necessary to be calculated on each point. That is, the calculation necessary to obtain U* is just the calculation to obtain the matrix $K_{AC}$ on each point repeatedly.

Here is explained what the matrix $K_{AC}$ is. Two kinds of methods to express the load and the displacement of the structure are described for the explanation. First, the expressing method of the structure with structural stiffness matrix is explained. The structure is expressed with dividing to mesh elements corresponding to finite elements of FEM. The number of the elements may extend to one million in some example. Each node point of these elements is numbered sequentially and the force and the displacement applied thereon are represented by p and d with subscripts. Both of them are vectors. Here, only such case as the force is directly proportional to the displacement should be treated. That is, the case where the displacement is in linear relation with the force should be treated. This is expressed with Eq. (11).

$$\begin{Bmatrix} p_1 \\ p_2 \\ \vdots \\ p_A \\ \vdots \\ p_B \\ \vdots \\ p_C \\ \vdots \\ p_n \end{Bmatrix} = \begin{bmatrix} (11) & (12) & & & & \\ (21) & (22) & & & & \\ & & (AA) & (AB) & (AC) & \\ & & (BA) & (BB) & (BC) & \\ & & (CA) & (CB) & (CC) & \\ & & & & & (nn) \end{bmatrix} \begin{Bmatrix} d_1 \\ d_2 \\ \vdots \\ d_A \\ \vdots \\ d_B \\ \vdots \\ d_C \\ \vdots \\ d_n \end{Bmatrix} \quad (11)$$

The other elements of the matrix are omitted in the equation. As the number n of the nodes sometimes becomes extremely large, the number n*n of the elements of this matrix becomes very large. Moreover, p and d are both vectors. Each of them is composed of three scalars. One element of the matrix in Eq. (11) is composed of 3*3 scalars. So, actually, it is composed of even more elements. This matrix is well known as the stiffness matrix in FEM. It is the main calculation in FEM to solve this simultaneous equation considering the displacement of rigid body. As the number of the elements is large, this calculation takes a much of time. As usual, it is calculated with general-purpose calculation software. The first expression method is to express the relation between the load and the displacement of the structure with this stiffness matrix.

Next, here is explained the method to express the structure with only three points in the case to give the loading point A, the supporting point B and the arbitrary point C. In the case that a certain structure is expressed with only three points A, B and C with respect the arbitrary point C, the mesh of FEM becomes disrelated. It becomes the relation between the load and the displacement with respect to only tree points. The equation of the relation is simple and it is expressed with above Eq. (2).

K with subscript in this expression is called the internal stiffness matrix. The element of this matrix is 3*3 as seen in Eq. (2). Besides, its one element is also composed of 3*3 scalars. That is, the matrix of Eq. (2) is composed of 9*9 scalars. The second expression method is to express the relation between the load and the displacement of the structure with this internal stiffness matrix. This $K_{AC}$ in Eq. (2) is $K_{AC}$ in Eq. (9). That is, if this $K_{AC}$ is obtained, U* will be obtained by Eq. (9). The detail of the above explanation could be obtained by referring to the following reports on U* with abstracts by the inventors of this invention.

In the non-patent document 1, Conditions for desirable structures based on a concept of load transfer courses is reported. A new concept of a parameter U* is introduced to express load transfer courses for a whole structure. A degree of connection between a loading point and an internal arbitrary point in the structure can be quantitatively expressed with the parameter U*. Based on the proposed concept, three conditions for desirable structures are introduced: (1) Continuity of U*, (2) Linearity of U*, (3) Consistency of courses. After introducing these three conditions as objective functions, structural optimization with numerical computation is carried out. Despite the fact that no concept of stresses or strains is introduced, the obtained structure has a reasonable shape. Finally, the load transfer courses for a simple structure are experimentally measured and these values demonstrate that the parameter U* can effectively be used.

In the non-patent document 2, Vibration Reduction for Cabins of Heavy-Duty Trucks with a Concept of Load Path is reported. The load transfer paths in the cabin structures of heavy-duty trucks are investigated under static loading and the results are applied to the vibration reduction of cabins. In a preliminary simulation using a simple model, it is shown that the floor panel vibration is closely related to the stiffness of the front cross-member of the floor structure. Load path analyses using the finite element method show that the load paths have some discontinuities and non-uniformities in the front cross-member which cause the low stiffness of the member.

In the non-patent document 3, Application of ADAMS for Vibration Analysis and Structure Evaluation By NASTRAN for Cab Floor of Heavy-Duty Truck is reported. The load transfer paths in the cabin structures of heavy-duty trucks are investigated under static loading, and the results are applied to the reduction of vibration in cabins. In a preliminary simulation using a simple model with ADAMS/Vibration, it is shown that vibration in the floor panel is closely related to the stiffness of the front cross-member of the floor structure. Load path analyses using the finite element method with NASTRAN show that the load paths have some discontinuities and non-uniformities in the front cross-member, reducing that member's stiffness.

In the non-patent document 4, ADAMS application for the floor vibration in the cabin of heavy-duty trucks and U* analysis of the load path by NASTRAN is reported. Realization of lightweight, cost-effective structures of heavy-duty trucks is an important aspect of structural designs, and numerical analyses have played a key role in this regard. In a preliminary simulation using ADAMS/Vibration, it is shown that the floor panel vibration is closely related to the stiffness of the front cross-member. Load path analyses using MSC/NASTRAN show that the load transfer paths have some discontinuities and non-uniformities in the front cross-member.

In the non-patent document 5, Expression of Load Transfer Paths in Structural Analysis and its Applications is reported. A new parameter U* is introduced to express the load transfer path using FEM. As an example, load path U* analysis is applied to a plate structure with a circular hole. Although the effect of stress concentration suggests strong force transfer at the corner of the hole, the obtained position of the load transfer path avoids a corner of the hole. This result coincides with their intuitive prediction. Moreover, they try to extend the calculation method of U* analysis to a structure with more complex boundary conditions. The effectiveness of the introduced method is verified using the FEM model of an actual heavy-duty track cab.

In the non-patent document 6, Load Path Optimization and U* Structural Analysis for Passenger Car Compartments under Frontal Collision is reported. A new concept, a parameter U*, is introduced to express load transfer in a structure. Two cases of U* analysis for a floor structure of a passenger compartment are examined. In the first case, three conditions of U* are introduced as objective functions, and GA structural optimization is applied. The emergent floor structure after the GA calculation has a unique shape in which a member connects the frontal part of an under-floor member and the rear part of a side-sill. In the second case, the U* values and the load paths in a floor structure under collision are calculated by use of PAM-CRASH. As the collision progresses, the under-floor member becomes the principal load path, and in the final stage of the collision the roll of the under-floor member becomes dominant.

In the non-patent document 7, Vibration reduction in the cabins of heavy-duty trucks using the theory of load transfer paths is reported. The objective of this study is to investigate the load transfer paths in the cabin structures of heavy-duty trucks under static loading, and to apply the results to reduce vibration in cabins. In a preliminary simulation using a simple model, it is shown that the floor panel vibration is closely related to the stiffness of the front cross-member of the floor structure. Load path U* analyses using the finite element method show that the low stiffness of the front cross-member is caused by discontinuities and non-uniformities in the load paths.

In the non-patent document 8, Expression of Load Transfer Paths in Structures is reported. A concept of a parameter U* has been introduced by the authors to express load transfer paths in a structure. In this paper, matrix formulation of internal stiffness shows that the value of U* expresses a degree of connection between a loading point and an internal arbitrary point. Stiffness fields, stiffness lines, and stiffness decay vectors are defined using newly introduced U* potential lines. A concept of a load path can be expressed as a stiffness line that has a minimum stiffness decay vector. A simple model structure is calculated using FEM for an application of U* analysis. The distribution of U* values shows that a diagonal member between a loading point and a supporting point plays an important role for the load transfer.

In the non-patent document 9, Experimental study of U* analysis in load transfer using the actual heavy-duty track cabin structure and scaled model is reported. The distribution of U* is known to represent the load transfer path in the structure. Two experimental measuring method of U* is developed of U* with respect to the actual heavy-duty truck cabin structure and the scaled plastic model. In these methods, different from the conventional method, the stiffness data of each member is not necessary. In FEM, the effect of the actual plate to play the important role in U* analysis cannot be expressed. By using the plastic scaled model, the strengthening effect can be directly measured according to the distribution of U* value.

Non-patent document 1: Kunihiro Takahashi; Conditions for desirable structures based on a concept of load transfer courses, Proc. ISEC-01, pp. 699-702, 2001.

Non-patent document 2: Toshiaki Sakurai, Hiroaki Hoshino, Kunihiro Takahashi; Vibration Reduction for Cabins of Heavy-Duty Trucks with a Concept of Load Path, Proc. JSAE No. 36-02, pp. 5-8, 2002 (in Japanese with English summary).

Non-patent document 3: Hiroaki Hoshino, Toshiaki Sakurai, Kunihiro Takahashi; Application of ADAMS for Vibration Analysis and Structure Evaluation By NASTRAN for Cab Floor of Heavy-Duty Truck, The 1st MSC.ADAMS European User Conference, London, November, 2002.

Non-patent document 4: Toshiaki Sakurai, Hiroaki Hoshino, Masatoshi Abe, Kunihiro Takahashi; ADAMS Application for the Floor Vibration in the Cabin of Heavy-duty Trucks and U* Analysis of the Load Path by NASTRAN, (MSC.ADAMS User Conference 2002).

Non-patent document 5: Toshiaki Sakurai, Masatoshi Abe, Soei Okina, Kunihiro Takahashi; Expression of Load Transfer Paths in Structural Analysis and its Applications, Trans. JSCES, Vol. 8, pp. 401-404, May 2003.

Non-patent document 6: Toshiaki Sakurai, Junichi Tanaka, Akinori Otani, Changjun Zhang, Kunihiro Takahashi; Load Path Optimization and U* Structural Analysis for Passenger Car Compartments under Frontal Collision, International Body Engineering Conference 2003, pp. 181-186, JSAE 20037007, SAE 2003-01-2734, 2003.

Non-patent document 7: Hiroaki Hoshino, Toshiaki Sakurai, Kunihiro Takahashi: Vibration reduction in the cabins of heavy-duty trucks using the theory of load transfer paths, JSAE Review 24 (2003) 165-171.

Non-patent document 8: Kunihiro Takahashi, Toshiaki Sakurai: Expression of Load Transfer Paths in Structures, J. JSME, (A)71-708 (2005), pp. 1097-1102.

Non-patent document 9: Kengo Inoue, Yuichiro Ichiki, Ikuma Matsuda, Toshiaki Sakurai, Hideaki Ishii, Tetsuo Nohara, Hiroaki Hoshino, Kunihiro Takahashi: Experimental study of U* analysis in load transfer using the actual heavy-duty track cabin structure and scaled model, Proc. JSAE, No. 90-04, pp. 27-30, 2004.

Problem to be Solved by the Invention

However, in the conventional calculating method, there is a problem of too much calculation time. It takes very long calculation time to calculate the U* distribution value of whole structure by FEM. In some case, the repeating calculation of million times is necessary. This amount of calculation times is the problem to calculate the U* distribution. The main part of structural calculation is that of the simultaneous equation. This calculation needs a very long time. The reason is why a big simultaneous equation needs to be solved at every calculation. When the calculation is performed with one point in the structure is fixed one after another, at each time, the whole calculation must be repeated. Therefore, In the case of a big calculation model, all the calculation cannot be completed. In a big structure, with today's fastest personal computer, this one-time calculation needs a long time. If the simultaneous equation is solved at each point to obtain all the U* value of whole structure, all the calculation would take for months. For example, if there were seventy thousand node points to consist the FEM model of a passenger-car body, it would take for forty days. It is not realistic.

BRIEF SUMMARY OF THE INVENTION

The object of this invention is to shorten the calculation time very much in the numerical structural analysis system based on the load transfer path method by solving the above problem.

Means to Solve the Problem

In order to solve the above problem, in this invention, the numerical structural analyzing system to perform the structural analysis of the objective structure of analysis by the load-transfer-path method with the finite-element method computing means to compute the deformation of the objective structure of analysis with the finite-element method depending upon the structural stiffness matrix of the objective structure of analysis is structured as follows. The numerical structural analysis system comprises a position changing means to change the variable loading point in order to follow sequentially all the necessary points of the objective structure of analysis, a inspection loading setup means to set up the calculation parameters in order to apply the three independent inspection loadings sequentially to the variable loading points selected said position changing means with the specific loading point and the support point fixed, a means to calculate the displacement value at said variable loading point and the load value at said specific loading point calculating the deformation with said finite-element method computing means under the condition with said inspection loading, and a simultaneous equation computing means to compute the partial stiffness matrix $K_{AC}$ by solving the multidimensional simultaneous linear equation with less than or equal to nine unknowns depending upon the internal stiffness matrix of the objective structure of analysis, the displacement at said variable loading point and the load value at said specific loading point.

And also, the numerical structural analysis system comprises a first inverse matrix computing means to compute the inverse matrix of the structural stiffness matrix without the elements with respect to the support point, a position renewal means to renew the variable loading point in order to follow sequentially all the necessary points of the objective structure of analysis, a sub-matrix extraction means to make a sub-matrix by extracting from said inverse matrix the elements with respect to said specific loading point and said variable loading point, and a second inverse matrix computing means to obtain the partial stiffness matrix $K_{AC}$ by computing the inverse matrix of said sub-matrix.

ADVANTAGES OF THE INVENTION

According to the above construction, in the numerical structural analysis system to analyze the objective structure with the load transfer path method utilizing FEM, the calculation time to analyze the whole structure can be reduced to the practical range as the whole stiffness parameters can be obtained with only one calculation of the simultaneous equation with respect to the structural stiffness matrix. Therefore, the stiffness parameter to represent the force transfer can be available with practical utility. As the calculation of the simultaneous equation of structural stiffness matrix needs only once, the calculation time can be reduced greatly.

BRIEF DESCRIPTION OF THE SEVERAL VIEW OF THE DRAWINGS

FIG. 1 It shows the concept of the numerical structure analysis system of this invention.

Figure 2:
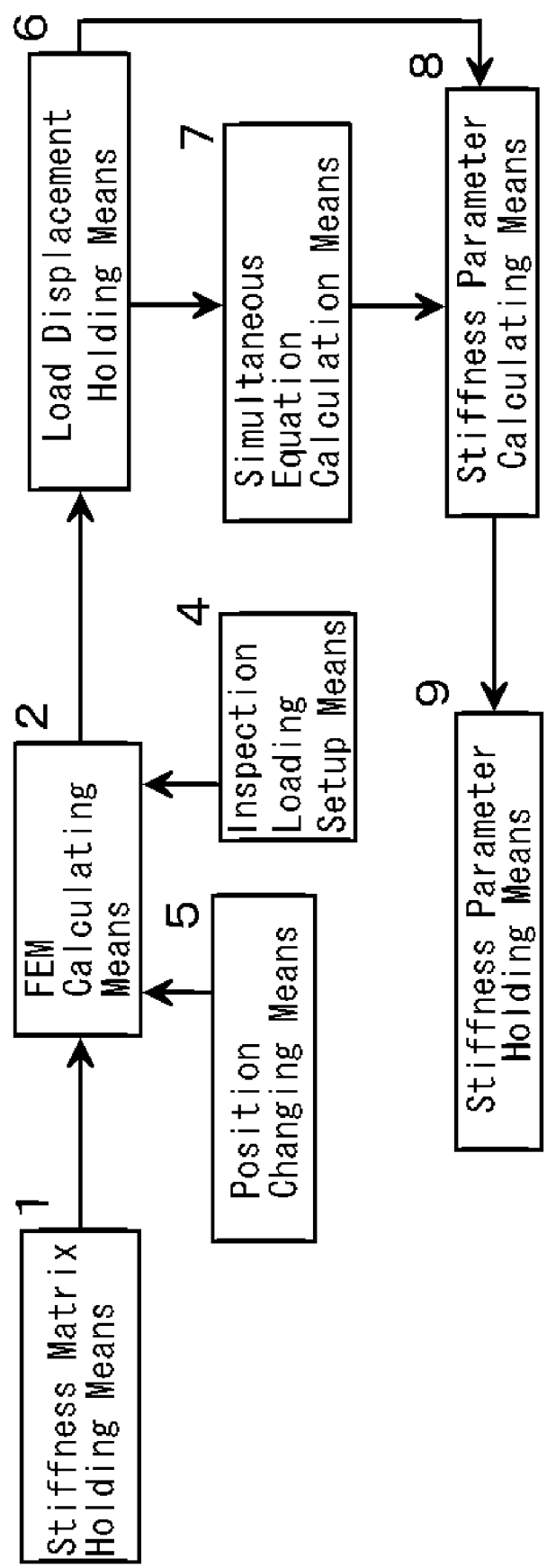

FIG. 2 It shows the structural concept of the numerical structure analysis system of the first embodiment of this invention.

Figure 3:
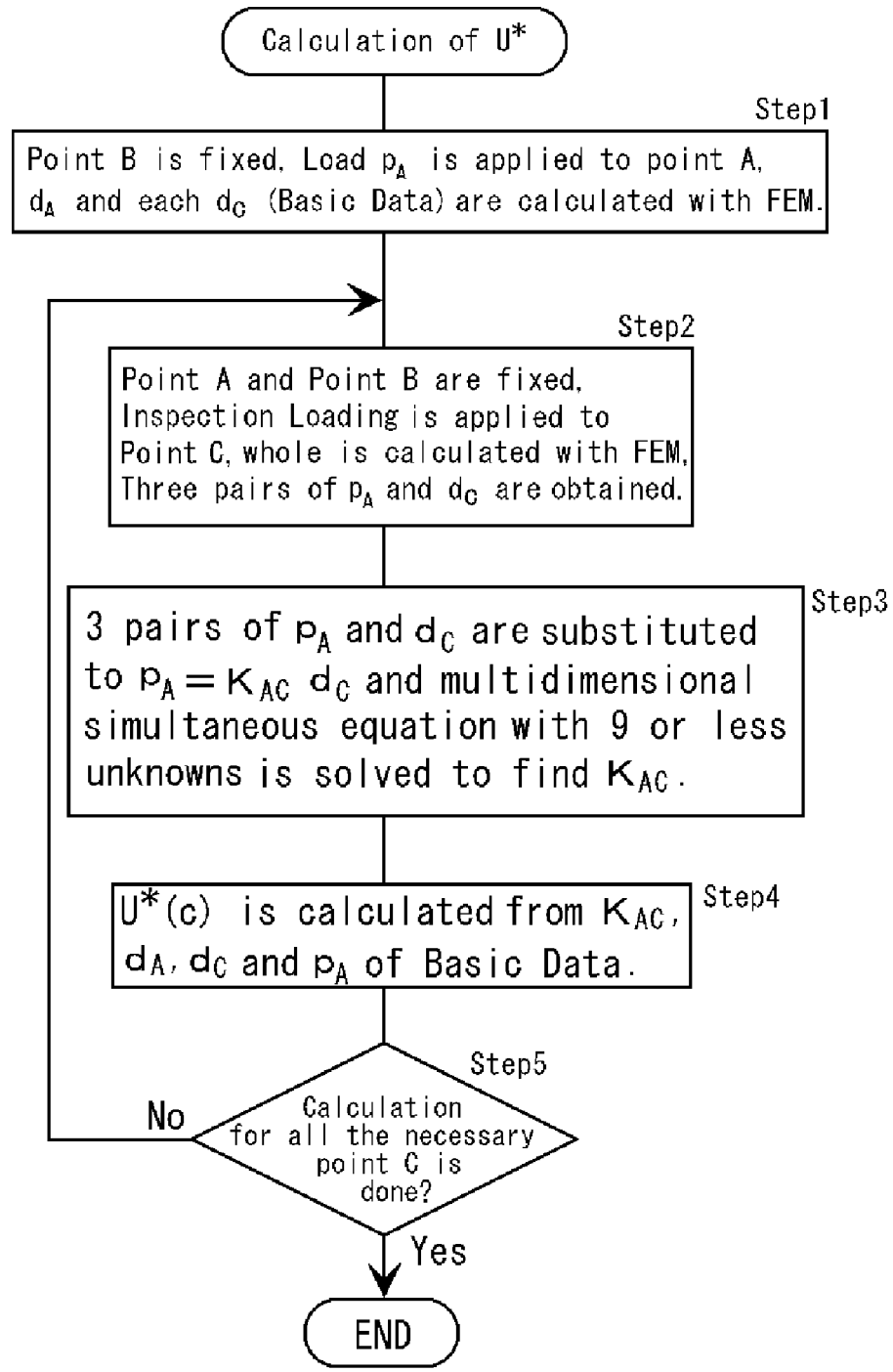

FIG. 3 It is the flowchart to show the operational sequence of the numerical structure analysis system of the first embodiment of this invention.

FIG. 4 It shows the calculation result by the numerical structure analysis system of the first embodiment of this invention.

FIG. 5 It shows the calculation result by the numerical structure analysis system of the first embodiment of this invention.

Figure 6:
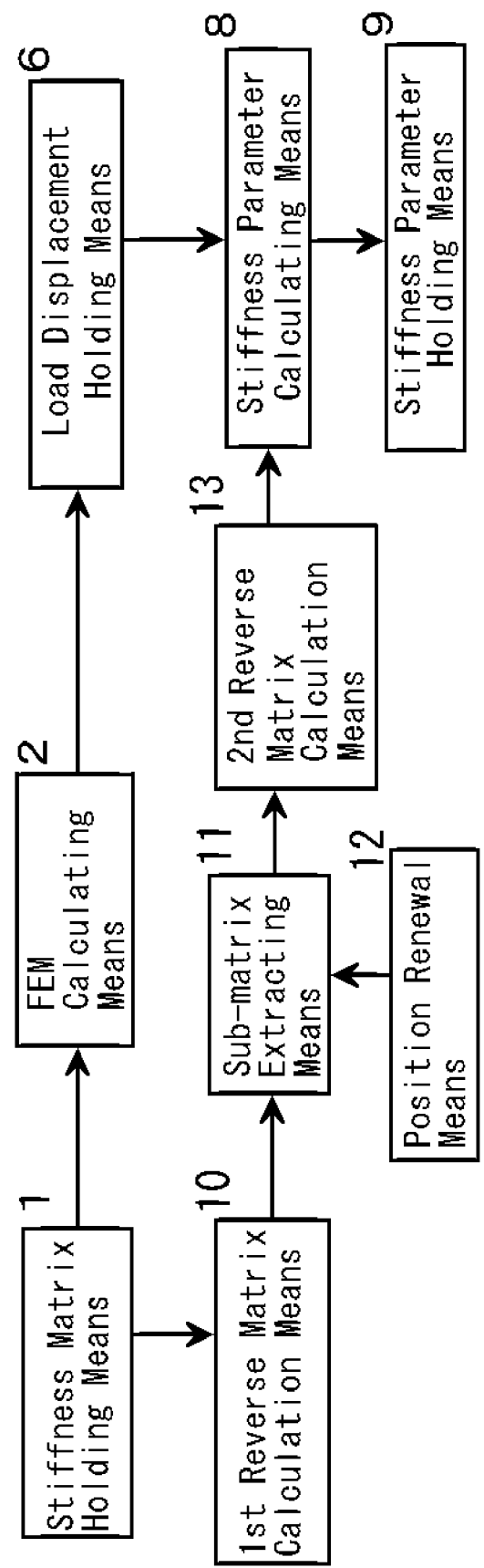

FIG. 6 It shows the structural concept of the numerical structure analysis system of the second embodiment of this invention.

Figure 7:
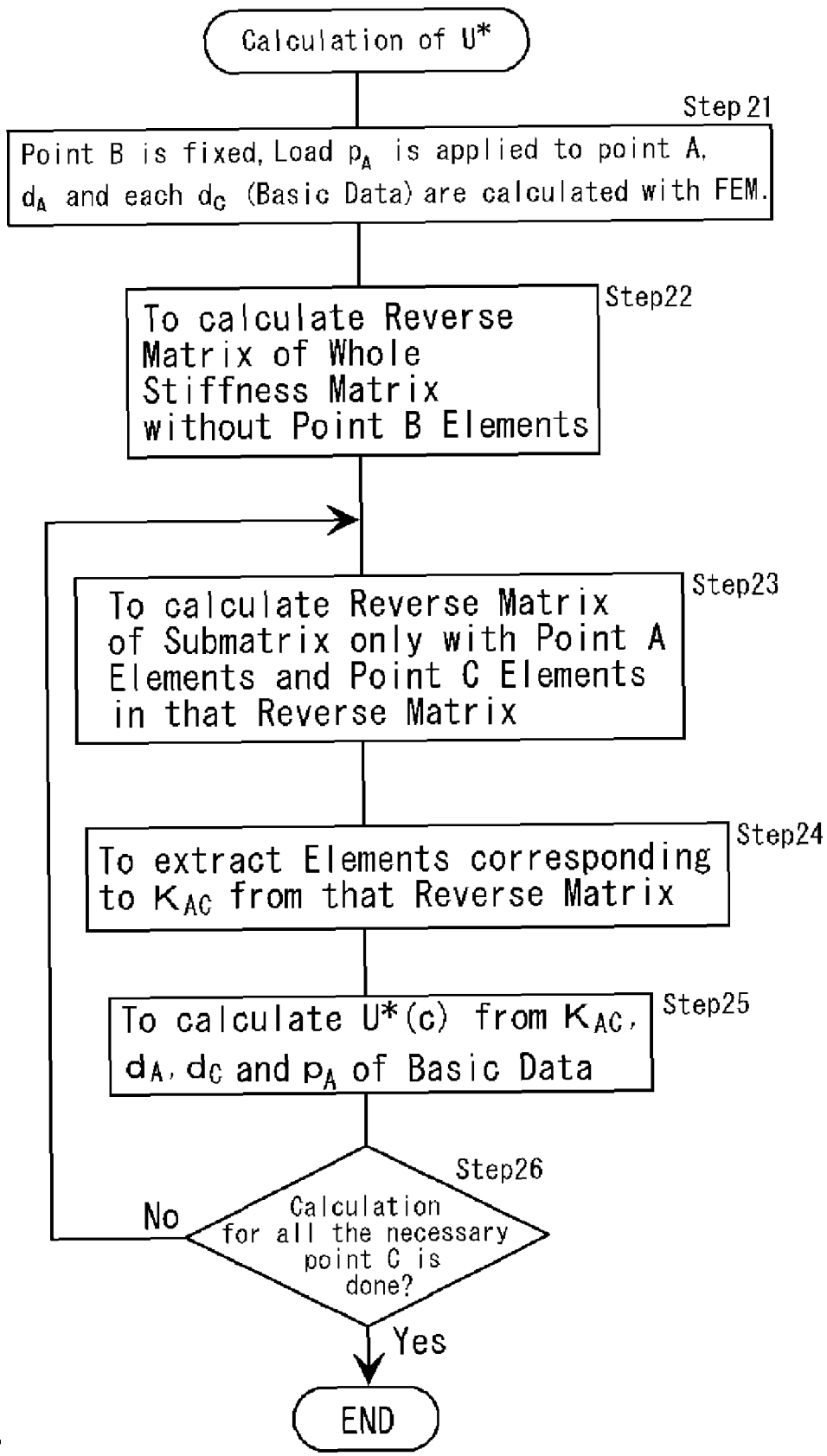

FIG. 7 It is the flowchart to show the operational sequence of the numerical structure analysis system of the second embodiment of this invention.

FIG. 8 It shows the model of arbitrary linear elastic structure.

Figure 9:
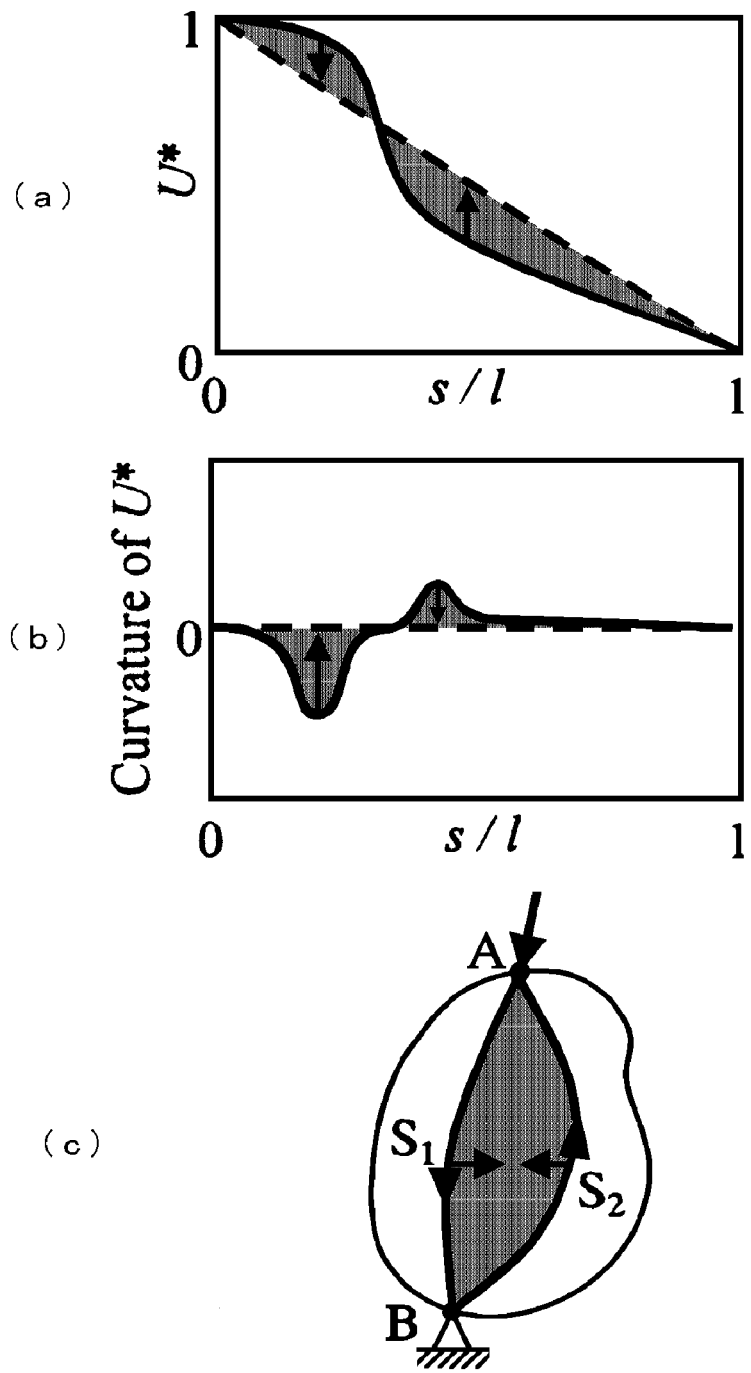

FIG. 9 It shows the boundary condition to calculate U* and the relation between the U* distribution and the load transfer path.

DETAILED DESCRIPTION OF THE INVENTION

The most preferable embodiment of the invention

Hereinafter, referring to FIGS. 1-7, the most preferable embodiments of the invention are explained particularly.

Embodiment 1

The first embodiment of this invention is the numerical structural analysis system constructed as follows. The specific loading point A and the supporting point B in the objective structure are fixed. Three independent inspection loadings are applied on the variable loading point C. Three displacements are obtained by the calculation of the loading value and the displacement of the variable loading point C with FEM. The multidimensional simultaneous linear equation with unknowns less than or equal to nine depending upon the internal stiffness matrix, the displacement of the variable loading point C and the load value of the specific loading point A is solved to obtain the partial stiffness matrix $K_{AC}$. U* (C) is obtained with respect to all the necessary point C with changing the variable loading point C.

FIG. 1 shows the concept of the numerical structural analysis system of this invention. This is the numerical structural analysis system to analyze the objective structure with load transfer path method. FIG. 2 shows the concept of the numerical structural analysis system of the first embodiment of this invention. In FIG. 1 and FIG. 2, the stiffness matrix holding means 1 is the means to hold the structural stiffness matrix of the objective structure. The FEM calculation means 2 is the means to calculate the deformation depending on the structural stiffness matrix with FEM. The partial stiffness matrix calculating means 3 is the means to obtain the partial stiffness matrix $K_{AC}$. The inspection loading setup means 4 is the means to set up the calculation parameter so as to apply the inspection loading to the specific loading point A and the variable loading point C in the objective structure. The position changing means 5 is the means to change the variable loading point C as to follow one by one all the necessary points in the objective structure. The specific loading point A is the point to apply the load to investigate the load transfer path of the objective structure. The supporting point B is the base point to support the objective structure. The variable loading point C is the point selected as to follow all the necessary points in the objective structure. All the necessary points mean all the points selected as necessary for the analysis aim among the node points of FEM.

The load displacement holding means 6 is the means to hold the inspection loading value and the result displacement. The simultaneous equation calculating means 7 is the means to solve the multidimensional simultaneous linear equation with unknowns not more than nine to obtain the partial stiffness matrix $K_{AC}$ based upon the inspection loading value and the displacement. The stiffness parameter calculating means 8 is the means to calculate the value of the stiffness parameter U* according to the partial stiffness matrix $K_{AC}$ and the displacement. The stiffness parameter holding means 9 is the means to hold the result value of U*. FIG. 3 is the flowchart to show the operational sequence of the numerical structure analysis system. FIG. 4 and FIG. 5 show the calculation results by the numerical structure analysis system.

The operation of the numerical structure analysis system of the first embodiment of this invention as structured above is explained. First, the principle of the calculation method is explained. Consider the following Eq. (2) to represent the relation between the load and the displacement of three points in the objective structure, that is, the specific loading point A, the supporting point B and the variable loading point C.

$$\begin{Bmatrix} p_A \\ p_B \\ p_C \end{Bmatrix} = \begin{bmatrix} K_{AA} & K_{AB} & K_{AC} \\ K_{BA} & K_{BB} & K_{BC} \\ K_{CA} & K_{CB} & K_{CC} \end{bmatrix} \begin{Bmatrix} d_A \\ d_B \\ d_C \end{Bmatrix} \quad (2)$$

In Eq. (2), as the supporting point is fixed, the displacement $d_B$ of the supporting point B is zero.

$$d_B = 0 \quad (12)$$

Therefore, the elements with respect to the supporting point B in Eq. (2) can be omitted to describe. Thus, Eq. (2) can be expressed as Eq. (13). This operation is same as carried out in FEM very ordinarily.

$$\begin{Bmatrix} p_A \\ p_C \end{Bmatrix} = \begin{bmatrix} K_{AA} & K_{AC} \\ K_{CA} & K_{CC} \end{bmatrix} \begin{Bmatrix} d_A \\ d_C \end{Bmatrix} \quad (13)$$

Moreover here, consider fixing the specific loading point A. In this case, as Eq. (14) holds, Eq. (13) reduced more simple as expressed as Eq. (15).

$$d_A = 0 \quad (14)$$

$$\{p_A\} = [K_{AC}]\{d_C\} \quad (15)$$

Under this condition, the independent inspection loading is applied to the variable loading point C and the calculation of whole structure is carried out with FEM. From that result, the displacement $d_C$ of the variable loading point C and the load $p_A$ of the specific loading point A at that time are obtained. The value is substituted into Eq. (15). As the displacement $d_C$ and the load $p_A$ are three-dimensional vectors, three equations are obtained from the substitution. In the same way, three-directional inspection loadings are applied on the variable loading point C to obtain three equations additionally. As three independent loads can apply in three-dimensional space, nine independent equations can be obtained totally.

As the partial stiffness matrix $K_{AC}$ is composed of nine elements, all the elements of the partial stiffness matrix $K_{AC}$ can be obtained according to nine independent equations obtained by giving the inspection loading. As this calculation is to solve the multi-dimensional simultaneous linear equation with unknowns not more than nine, it takes very short time to calculate. Depending upon the symmetry of the objective structure, the positional relation of the variable loading point C and so on, the number of the independent element of the partial stiffness matrix $K_{AC}$ may be less than nine. The unknowns are less than nine at that time.

This operation needs only to apply the independent load on each variable loading points C. By the displacement method of FEM, even if the loading condition may be many, whole simultaneous equation must be solved only once. Therefore, the calculation time is marvelously reduced. About a car body, with this method, the partial stiffness matrix $K_{AC}$ is calculated. The value of the stiffness parameter $U^*$ is obtained. Without this method, it cannot be calculated in a practical time at all.

Besides, there are several parameters like $U^*$ in relation with $U^*$ as the stiffness parameter that is represented in scalar utilizing the partial stiffness matrix $K_{AC}$. They are inclusively called as $U^*$ group. $U^*$ group is that of several parameters utilizing the partial stiffness matrix $K_{AC}$ such as $(K_{AC} d_C) \cdot d_A$ or $(K_{AC} d_A) \cdot d_A$. And, without the definition of energy, the equivalent expression to that can be defined with co-energy. The examples other than $U^*$ of $U^*$ group member are shown as follows.

$U^*_{II}$ means the spring constant between the loading point A and the arbitrary point C with the arbitrary point free. It is defined in $U^*_{II}$ as the connective strength between the point A and the point C. In $U^*_{II}$ is derived the strain energy charged in the spring between the loading point A and the arbitrary point C when the load is applied to the structure. And, it is divided by the relative displacement between the point A and the point C. Then the spring constant between the point A and the point C is derived. $U^*_{II}$ is represented by the following equation.

$$U^*_{II}=1 \cdot (p_A \cdot d_A)|d_A-d_C|^2/\{(2|d_A|^2) \times (K_{AC}d_C-K_{CA}d_A) \cdot (d_A-d_C)\}$$

$K_{CA}$ is the transposed matrix of $K_{AC}$.

$U^*_{III}$ means physically the spring constant between the loading point A and the arbitrary point C when the arbitrary point C is fixed. In the $U^*$ theory, this parameter is defined as the connectivity strength between the points A and C. In the $U^*$ theory, the connectivity strength between the points A and C is derived by way that the matrix $K_{CA}$ to show the internal stiffness between the points A and C in the structure is converted to a scalar. $U^*_{III}$ is represented with the following formula.

$$U^*_{III}=1+(p_A \cdot d_A)/\{2(K_{CA}d_A) \cdot d_A\}$$

When n loading points exist in the structure, $U^*_{III}$ is represented as the sum of the connective strength between the loading points A1-An and the arbitrary point C. This means that the connective strength between the arbitrary loading point and the point C can be represented by way that the matrix $K_{CAn}$ representing the connective strength between the desired loading point An and the point C is obtained respectively and they are summed up even when the boundary condition of plural loading points is given. $U^*_{III}$ of plural loading points is represented with the following formula.

$$U^*_{III}=1-(1/2)\{\Sigma(-K_{CAn}d_{An} \cdot d_{An}/|d_{An}|^2)\}^{-1} \times \{\Sigma p_{An} \cdot d_{An}/|d_{An}|^2\}^{-1}$$

$U^*_{IV}$ means the spring constant among the points A, B and C. In $U^*_{IV}$ theory, it is defined as the connective strength among the points A, B and C. In $U^*_{IV}$ theory, the connective strength among the points A, B and C is derived by way that the strain energy that arises in the springs among the points A, B and C when the load is applied on the structure is derived and it is divided by the relative displacement between the points A and C. $U^*_{IV}$ is represented with the following formula.

$$U^*_{IV}=1+\{(K_{BA}d_A) \cdot d_A\}/\{(K_{AC}d_C-K_{CA}d_A) \cdot d_A\}$$

With regard to the parameters except $U^*$ in $U^*$ group, the boundary conditions at each point are defined a little differently from that of $U^*$. They are defined with such boundary condition that each point is neither constrained nor loaded. Any of those parameters can be derived from the partial stiffness matrix $K_{AC}$. So, the methods in the embodiments 1 and 2 can be applied to the calculation of the parameters. Then the calculation number of times of the reverse matrix can be reduced considerably. Finally, this invention can be said as the method to calculate the parameters of $U^*$ group defined in the structure by way of loading each points in the structure. Though the method to calculate $U^*$ is explained as the typical example in the embodiments 1 and 2, the other parameters in $U^*$ group can be calculated with the similar method.

Next, referring to FIG. 1, the functional outline of the numerical structure analysis system is explained. The structural stiffness matrix of the objective structure to be analyzed is held in the stiffness matrix holding means 1. The structural stiffness matrix may be calculated on the structural data or may be entered from the outside. The calculation parameter is set as the condition that the supporting point B of the objective structure is fixed. The inspection loading $p_A$ is applied on the specific loading point A. With the FEM calculation means 2, based upon the structural stiffness matrix, the deformation of the structure is calculated in FEM to find the displacement $d_A$ of the specific loading point A and the displacement $d_C$ of each point. The load displacement holding means 6 holds the data. These inspection loading $p_A$, displacement $d_A$ and displacement $d_C$ should be called as the basic data in order to distinguish from the data to calculate the partial stiffness matrix $K_{AC}$. With the partial stiffness matrix calculation means 3, the partial stiffness matrix $K_{AC}$ is calculated. The detail will be explained later. On the partial stiffness matrix $K_{AC}$ and the displacement data in the basic data and so on, with the stiffness parameter calculation means 8, the stiffness parameter $U^*$ is calculated and it is held in the stiffness parameter holding means 9.

Next, referring to FIG. 2, the functional detail of the numerical structure analysis system is explained. The inspection loading setup means 4 sets the calculation parameters in the condition that the specific loading point A and the supporting point B are fixed and three independent inspection loading $p_C$ are applied sequentially to the variable loading point C selected by the position selecting means 5. With respect to this condition of inspection loading application, the FEM calculation means 2 calculates each displacement and the load displacement holding means 6 holds the data. Based on the load at the specific loading point and the displacement at the variable loading point, the simultaneous equation calculating means 7 solves the multidimensional simultaneous linear equation with 9 unknowns or less to find the partial stiffness matrix $K_{AC}$. According to the partial stiffness matrix $K_{AC}$ and the displacement and the load of basic data, the stiffness parameter calculating means 8 calculates the value of the stiffness parameter $U^*$ and the stiffness parameter holding means 9 holds the data.

$$U^*=\{1-(p_A \cdot d_A)/\{(K_{AC}d_C) \cdot d_A\}\}^{-1} \quad (9)$$

The position changing means 3 changes the variable loading point C as to follow sequentially all the necessary points in the objective structure to be analyzed and the value of $U^*$ at all the necessary points is calculated.

Next, referring to FIG. 3, the operational sequence of the numerical structure analysis system is explained. In the step 1, the deformation is calculated depending upon the structural stiffness matrix with FEM to find the basic data of the displacement at each point and so on. That is, the calculation parameters are set in the condition that the supporting point B is fixed and the inspection loading is applied to the specific loading point A. The deformation of the objective structure is calculated with FEM according to the structural stiffness matrix to find the displacement. This part is same as the conventional method. In the step 2, the specific loading point A and the supporting point B are fixed and the inspection loading is applied to the variable loading point C. Then the load at the specific loading point A and the displacement at the variable loading point C are calculated with FEM. The whole calculation is necessary only once at the first. Three time calculations are performed with application of three independent inspection loadings to find three displacements. In the step 3, the load and the displacement at the specific loading point A are substituted for Eq. 15 and the multidimensional simultaneous linear equation with 9 unknowns or less is solved to find the partial stiffness matrix $K_{AC}$. In the step 4, the stiffness parameter U* (C) with respect to the variable loading point C is calculated according to the partial stiffness matrix $K_{AC}$ and the inspection loading and displacement of the basic data. In the step 5, the steps below the step 2 are repeated until the finish of the calculation of the stiffness parameter U* at all the necessary points in the objective structure to be analyzed.

Next, referring to FIGS. 4 and 5, the calculation results are explained. The server used for calculation is DELL PRECISION 360 with CPU of Intel Pentium (registered trademark) IV at 3.00 GHz, RAM of 2 GB, HDD of SATA 120 GB*4 (RAID 0) and OS of Microsoft Windows (registered trademark) 2000. The analysis solver is MSC.Nastran V2001. FIG. 4(a) shows the calculation result of the truck body model with 68000 nodes. The abscissa means the number of the points for the calculation of U*. The ordinate means the necessary time for calculation. As shown in FIG. 4(a), the calculation speed of this embodiment is about 13.2 times of the conventional method that the energy is calculated every time with each point fixed. FIGS. 4(b), 5(a) and 5(b) show the distributions of U* calculated at all the nodes of the truck body model in three planes. The distributions are shown with contours. The pitch of the contours is 0.5. The values of U* are written in the figures as possible. The analysis condition is that the displacement in vertical direction is applied to the connection part at left side of the body and the roof lower part in the upper body is fixed. With the method of this embodiment, in spite of high speed, the same contour distribution as with the conventional method is obtained.

In this embodiment of this invention as described above, the calculation time can be reduced so much as the numerical structure analysis system is constructed as follows.

The specific loading point A and the supporting point B in the objective structure are fixed. Three independent inspection loadings are applied on the variable loading point C. Three displacements are obtained by the calculation of the loading value and the displacement of the variable loading point C with FEM. The multidimensional simultaneous linear equation with unknowns less than or equal to nine depending upon the internal stiffness matrix, the displacement of the variable loading point C and the load value of the specific loading point A is solved to obtain the partial stiffness matrix $K_{AC}$. U* (C) is obtained with respect to all the necessary point C with changing the variable loading point C.

Embodiment 2

The second embodiment of this invention is the numerical structural analysis system constructed as follows. The reverse matrix of the structural stiffness matrix except the elements with respect to the supporting point B is calculated. The reverse matrix of the submatrix extracted the elements with respect to the specific loading point A and the variable loading point C from the former reverse matrix. The elements corresponding to the partial stiffness matrix $K_{AC}$ are extracted from the latter reverse matrix. U* (C) is calculated with respect to all the necessary variable loading points with changing the variable loading point C.

FIG. 6 shows the structural concept of the numerical structure analysis system of the second embodiment of this invention. In FIG. 6, the stiffness matrix holding means 1 is the means to hold the structural stiffness matrix of the objective structure. The FEM calculation means 2 is the means to calculate the deformation depending on the structural stiffness matrix with FEM. The stiffness parameter calculation means 8 is the means to calculate the value of U* from the partial stiffness matrix $K_{AC}$ and so on. The stiffness parameter holding means 9 is the means to hold the value of U* of the calculation result. The first reverse matrix calculation means 10 is the means to calculate the reverse matrix of the structural stiffness matrix except the elements with respect to the supporting point B. The sub-matrix extracting means 11 is the means to extract the elements with respect to the specific loading point A and the variable loading point C to make a sub-matrix. The position renewal means 12 is the means to renew the variable loading point C. The second reverse matrix calculation means 13 is the means to calculate the reverse matrix of the sub-matrix. FIG. 7 is the flowchart to show the operational sequence of the numerical structure analysis system.

The operation of the numerical structure analysis system of the second embodiment of this invention as structured above is explained. First, the principle of the calculation method is explained. This method is the method to derive the matrix corresponding to $K_{AC}$ directly from the structural stiffness matrix of the structure without using the internal stiffness matrix. The structural stiffness matrix is shown again in Eq. (11).

$$\begin{Bmatrix} p_1 \\ p_2 \\ \vdots \\ p_A \\ \vdots \\ p_B \\ \vdots \\ p_C \\ \vdots \\ p_n \end{Bmatrix} = \begin{bmatrix} (11) & (12) & & & & & \\ (21) & (22) & & & & & \\ & & & & & & \\ & & (AA) & (AB) & (AC) & \\ & & & & & & \\ & & (BA) & (BB) & (BC) & \\ & & & & & & \\ & & (CA) & (CB) & (CC) & \\ & & & & & & (nn) \end{bmatrix} \begin{Bmatrix} d_1 \\ d_2 \\ \vdots \\ d_A \\ \vdots \\ d_B \\ \vdots \\ d_C \\ \vdots \\ d_n \end{Bmatrix} \quad (11)$$

As the supporting point B is a fixed point, the rows and columns of Eq. (11) with respect to that point can be eliminated. Therefore, Eq. (11) is expressed as the following Eq. (12) without the rows and columns with respect to the supporting point B. This step is the ordinary operation sequence in FEM.

$$\begin{Bmatrix} p_1 \\ p_2 \\ \vdots \\ p_A \\ p_C \\ \vdots \\ p_n \end{Bmatrix} = \begin{bmatrix} (11) & (12) & & & \\ (21) & (22) & & & \\ & & (AA) & (AC) & \\ & & (CA) & (CC) & \\ & & & & (nn) \end{bmatrix} \begin{Bmatrix} d_1 \\ d_2 \\ \vdots \\ d_A \\ d_C \\ \vdots \\ d_n \end{Bmatrix} \quad (16)$$

Eq. (13) is shown again below.

$$\left\{\begin{array}{c}p_A\\p_C\end{array}\right\} = \begin{bmatrix}K_{AA} & K_{AC}\\K_{CA} & K_{CC}\end{bmatrix}\left\{\begin{array}{c}d_A\\d_C\end{array}\right\} \quad (13)$$

To be noticed here is that the element (AC) in Eq. (16) is not the same quantity as the $K_{AC}$ in Eq. (13). The reason is that the displacement vector in the right side is not zero at each point.

Then next, the reverse matrix of the matrix in Eq. (16) is calculated, the reverse matrix is multiplied at left to both side of Eq. (16) and the left side and the right side are exchanged. The result is shown as Eq. (17). The matrix at right side is flexibility matrix. And the equation multiplied at left side of Eq. (13) with the reverse matrix of the matrix in Eq. (13) is shown as Eq. (18).

$$\left\{\begin{array}{c}d_1\\d_2\\\vdots\\d_A\\d_C\\\vdots\\d_n\end{array}\right\} = \begin{bmatrix}& & \\ & C_{AA}\,C_{AC} & \\ & C_{CA}\,C_{CC} & \\ & & \end{bmatrix}\left\{\begin{array}{c}p_1\\p_2\\\vdots\\p_A\\p_C\\\vdots\\p_n\end{array}\right\} \quad (17)$$

$$\left\{\begin{array}{c}d_A\\d_C\end{array}\right\} = \begin{bmatrix}C_{AA} & C_{AC}\\C_{CA} & C_{CC}\end{bmatrix}\left\{\begin{array}{c}p_A\\p_C\end{array}\right\} \quad (18)$$

It is important that the matrix elements in Eq. (18) have the same content as that of four matrix elements shown in Eq. (17). The reason is that the load vector at right side of Eq. (17) is zero except the specific loading point A and the variable loading point C. The matrix elements in Eq. (16) are already given when FEM is applied. The matrix elements of Eq. (17) of its reverse matrix can be obtained from those elements. That is, they are also the elements in Eq. (18). Finally, $K_{AC}$ in Eq. (13) to be obtained can be calculated with the calculation of the reverse matrix of that matrix. The feature of this method is to need no inspection loading.

Next, referring to FIG. 6, the function of the numerical structure analysis system is explained. The stiffness matrix holding means 1 holds the structural stiffness matrix of the objective structure. The FEM calculation means 2 calculate the deformation based on the structural stiffness matrix with FEM to obtain the basic data. The reverse matrix calculation means calculates the reverse matrix of the matrix except the elements with respect to the supporting point B. The sub-matrix extracting means extracts the elements with respect to the specific loading point A and the variable loading point C from the reverse matrix to make a sub-matrix. The position renewal means renews the variable loading point C. The reverse matrix calculation means calculates the reverse matrix of the sub-matrix. The stiffness parameter calculation means 8 calculates the value of U* from the partial stiffness matrix $K_{AC}$ and the basic data. The stiffness parameter holding means 9 holds the value of U* of calculation result.

Next, referring to FIG. 7, the operational sequence of the numerical structure analysis system is explained. In the step 21, the deformation based on the structural stiffness matrix is calculated with FEM to obtain the basic data as the displacement at each point and so on. In the step 22, the reverse matrix of the matrix except the elements with respect to the supporting point B. In the step 23, the elements with respect to the specific loading point A and the variable loading point C are extracted from that reverse matrix to make the sub-matrix and the reverse matrix of the sub-matrix is calculated. In the step 24, the elements corresponding to $K_{AC}$ are extracted from the reverse matrix of the sub-matrix. In the step 25, U* (C) is calculated from the partial stiffness matrix $K_{AC}$ and the displacement in the basic data etc. In the step 26, the steps below step 23 are repeated until to complete the calculation of all points.

In this embodiment of this invention as described above, the calculation time can be reduced so much as the numerical structure analysis system is constructed as follows. The reverse matrix of the structural stiffness matrix except the elements with respect to the supporting point B is calculated. The reverse matrix of the sub-matrix extracted the elements with respect to the specific loading point A and the variable loading point C from the former reverse matrix. The elements corresponding to the partial stiffness matrix $K_{AC}$ are extracted from the latter reverse matrix. U* (C) is calculated with respect to all the necessary variable loading points with changing the variable loading point C.

The disclosure may be implemented as a computer program stored on a computer readable storage or recording medium.

INDUSTRIAL AVAILABILITY

The numerical structure analysis system of this invention is most suitable as the numerical analysis system to design the vehicle structure or building strength etc with FEM.

REFERENCE NUMBERS

1 Stiffness matrix holding means
2 FEM calculation means
3 Partial stiffness matrix calculation means
4 Inspection loading setup means
5 Position changing means
6 Load displacement holding means
7 Simultaneous equation calculation means
8 Stiffness parameter calculation means
9 Stiffness parameter holding means
10 The first reverse matrix calculation means
11 Sub-matrix extracting means
12 Position renewal means
13 The second reverse matrix calculation means

The invention claimed is:

1. A numerical structural analyzing system to perform the structural analysis of the objective structure of analysis by the load-transfer-path method with the finite-element method computing means to compute the deformation of the objective structure for analysis with the finite-element method depending upon the structural stiffness matrix of the objective structure for analysis, comprising;

A position changing means to change the variable loading point in order to follow successively all the necessary points of the objective structure for analysis, An inspection loading setup means to set up the calculation parameters in order to apply the three independent inspection loadings successively to the variable loading points selected by said position changing means with the specific loading point and the support point fixed, A means to calculate the displacement value at said variable loading point and the load value at said specific loading point calculating the deformation with said finite-element method computing means under the condition with said inspection loading, and A simultaneous equation computing means to compute the partial stiffness matrix KAC by solving the multidimensional simultaneous linear equation with nine unknowns or less depending upon the internal stiffness matrix of the objective structure for analysis, the displacement at said variable loading point and the load value at said specific loading point.

2. The numerical structural analyzing system described in claim 1, comprising a stiffness parameter computing means to compute the scalar value of the stiffness parameter utilizing said partial stiffness matrix KAC.

3. A numerical structural analyzing system to perform the structural analysis of the objective structure for analysis by the load-transfer-path method with the finite-element method computing means to compute the deformation of the objective structure for analysis with the finite-element method depending upon the structural stiffness matrix of the objective structure for analysis, comprising;

A first reverse matrix computing means to compute the reverse matrix of the structural stiffness matrix without the elements with respect to the supporting point, A position renewal means to renew the variable loading point in order to follow successively all the necessary points of the objective structure for analysis, A sub-matrix extracting means to make a sub-matrix by extracting the elements with respect to said specific loading point and said variable loading point from said reverse matrix, and A second reverse matrix computing means to obtain the partial stiffness matrix KAC by computing the reverse matrix of said sub-matrix.

4. The numerical structural analyzing system described in claim 3, comprising a stiffness parameter computing means to compute the scalar value of the stiffness parameter utilizing said partial stiffness matrix KAC.

5. A numerical structural analyzing method to perform by computer the structural analysis of the objective structure for analysis by the load-transfer-path method by way of computing the deformation of the objective structure for analysis with the finite-element method depending upon the structural stiffness matrix of the objective structure for analysis, wherein the specific loading point and the supporting point are constrained, the calculation parameters are set up in order to apply the three independent inspection loadings to the selected loading points, the deformation is calculated each with finite-element method under the condition with said inspection loading, the displacement value at a variable loading point and the load value at said specific loading point, and the partial stiffness matrix KAC is computed by solving the multidimensional simultaneous linear equation with nine unknowns or less depending upon the internal stiffness matrix of the objective structure for analysis, the displacement at said variable loading point and the load value at said specific loading point, wherein the structure being analyzed comprises a vehicle structure or a building and outputting the results of said structural analysis to provide a design for said vehicle structure or said building.

6. The numerical structural analyzing method described in claim 5, wherein scalar value of the stiffness parameter is computed utilizing said partial stiffness matrix KAC, the variable loading point is renewed in order to follow successively all the necessary points of the objective structure for analysis, and the stiffness parameter value is computed with respect to all the variable loading points.

7. A numerical structural analyzing method to perform by computer the structural analysis of the objective structure for analysis by the load-transfer-path method by way of computing the deformation of the objective structure for analysis with the finite-element method depending upon the structural stiffness matrix of the objective structure for analysis, wherein the reverse matrix of the structural stiffness matrix without the elements with respect to the supporting point is computed, a sub-matrix is made by extracting the elements with respect to said specific loading point and said variable loading point from said reverse matrix, and the partial stiffness matrix KAC is computed by computing the reverse matrix of said sub-matrix, wherein the structure being analyzed comprises a vehicle structure or a building and outputting the results of said structural analysis to provide a design for said vehicle structure or said building.

8. The numerical structural analyzing method described in claim 7, wherein scalar value of the stiffness parameter is computed utilizing said partial stiffness matrix KAC, the variable loading point is renewed in order to follow successively all the necessary points of the objective structure for analysis, and the stiffness parameter value is computed with respect to all the variable loading points.

9. A computer readable storage medium storing program code to perform the numerical structural analyzing method in a computer, wherein said method comprises a numerical structural analyzing method to perform by computer the structural analysis of the objective structure for analysis by the load-transfer-path method by way of computing the deformation of the objective structure for analysis with the finite-element method depending upon the structural stiffness matrix of the objective structure for analysis, wherein the specific loading point and the supporting point are constrained, the calculation parameters are set up in order to apply the three independent inspection loadings to the selected loading points, the deformation is calculated each with finite-element method under the condition with said inspection loading, the displacement value at a variable loading point and the load value at said specific loading point, and the partial stiffness matrix KAC is computed by solving the multidimensional simultaneous linear equation with nine unknowns or less depending upon the internal stiffness matrix of the objective structure for analysis, the displacement at said variable loading point and the load value at said specific loading point.

* * * * *